(12) United States Patent
McCormick et al.

(10) Patent No.: US 9,702,937 B2
(45) Date of Patent: Jul. 11, 2017

(54) CONTACTOR CONTROL SYSTEM

(71) Applicant: LG Chem, Ltd., Seoul (KR)

(72) Inventors: Richard McCormick, Troy, MI (US); Stephen Frisby, Shelby Township, MI (US); Adnan Haider, Troy, MI (US)

(73) Assignee: LG Chem, Ltd., Seoul (KR)

( * ) Notice: Subject to any disclaimer, the term of this patent is extended or adjusted under 35 U.S.C. 154(b) by 355 days.

(21) Appl. No.: 14/688,271

(22) Filed: Apr. 16, 2015

(65) Prior Publication Data
US 2016/0236632 A1    Aug. 18, 2016

Related U.S. Application Data

(60) Provisional application No. 62/117,383, filed on Feb. 17, 2015.

(51) Int. Cl.
*B60L 1/00* (2006.01)
*B60L 3/00* (2006.01)
*H02G 3/00* (2006.01)
*G01R 31/327* (2006.01)
*G05B 9/02* (2006.01)
*G05B 11/01* (2006.01)
*G01R 31/02* (2006.01)

(52) U.S. Cl.
CPC ....... *G01R 31/327* (2013.01); *G01R 31/3277* (2013.01); *G05B 9/02* (2013.01); *G05B 11/01* (2013.01); *G01R 31/025* (2013.01); *Y02T 10/642* (2013.01)

(58) Field of Classification Search
CPC ........ G05B 9/02; G05B 11/01; G01R 31/025; G01R 31/3277; G01R 31/327; Y02T 10/642
See application file for complete search history.

(56) References Cited

U.S. PATENT DOCUMENTS

| | | | | |
|---|---|---|---|---|
| 4,423,362 A | * | 12/1983 | Konrad | ................... B60L 15/08 318/139 |
| 4,453,117 A | * | 6/1984 | Elms | ........................ H02H 7/09 318/434 |
| 4,922,363 A | | 5/1990 | Long et al. | |
| 5,493,468 A | | 2/1996 | Hunter et al. | |

(Continued)

FOREIGN PATENT DOCUMENTS

WO    2014007490 A1    1/2014

*Primary Examiner* — Jared Fureman
*Assistant Examiner* — Esayas Yeshaw
(74) *Attorney, Agent, or Firm* — Buckert Patent & Trademark Law Firm, PC; John F. Buckert

(57) ABSTRACT

A contactor control system having a primary microprocessor, a secondary microprocessor, a high side contactor control circuit, and a low side contactor control circuit is provided. The primary microprocessor sends a first command signal to the secondary microprocessor. The secondary microprocessor sends a command signal to the secondary grounding circuit for outputting a ground level voltage to a logical OR circuit to induce the logical OR circuit to output a ground level voltage to a second end of the contactor coil. The primary microprocessor sends a command signal to the secondary microprocessor, and in response the secondary microprocessor sends a command signal to the secondary pull-in circuit to activate the secondary pull-in circuit for energizing the contactor coil.

13 Claims, 7 Drawing Sheets

(56) References Cited

U.S. PATENT DOCUMENTS

| | | | |
|---|---|---|---|
| 6,192,300 B1 | 2/2001 | Watarai et al. | |
| 6,470,259 B1* | 10/2002 | Round | F02D 11/107 |
| | | | 123/397 |
| 6,693,409 B2* | 2/2004 | Lynch | H02J 3/18 |
| | | | 307/11 |
| 7,521,824 B2 | 4/2009 | Osawa | |
| 7,668,308 B1* | 2/2010 | Wurtz | H04R 3/00 |
| | | | 379/430 |
| 8,134,820 B1 | 3/2012 | Riccio et al. | |
| 9,625,894 B2* | 4/2017 | Kamenetz | G05B 19/0421 |
| 2002/0015362 A1* | 2/2002 | Cowgill | G11C 7/16 |
| | | | 369/11 |
| 2002/0194431 A1* | 12/2002 | Koo | G06F 12/0897 |
| | | | 711/122 |
| 2002/0199064 A1* | 12/2002 | Kim | G06F 12/121 |
| | | | 711/128 |
| 2004/0136522 A1* | 7/2004 | Wurtz | H04M 1/6058 |
| | | | 379/430 |
| 2006/0256488 A1 | 11/2006 | Benzing et al. | |
| 2013/0079902 A1* | 3/2013 | Kamenetz | G05B 19/0421 |
| | | | 700/82 |
| 2013/0157639 A1* | 6/2013 | Huppenthal | G06F 1/3234 |
| | | | 455/418 |
| 2014/0028322 A1 | 1/2014 | Tzivanopoulos | |
| 2014/0330397 A1* | 11/2014 | Kamenetz | G05B 15/02 |
| | | | 700/12 |

* cited by examiner

CONTACTOR CONTROL SYSTEM

CROSS-REFERENCE TO RELATED APPLICATIONS

This application claims priority to U.S. Provisional Patent Application No. 62/117,383 filed on Feb. 17, 2015, the entire contents of which are hereby incorporated by reference herein.

BACKGROUND

The inventors herein have recognized a need for an improved contactor control system that utilizes both a primary microprocessor and a secondary microprocessor for controlling operation of each contactor in a vehicle.

SUMMARY

A contactor control system in accordance with an exemplary embodiment is provided. The contactor control system includes a primary microprocessor and a secondary microprocessor adapted to operably communicate with one another. The contactor control system further includes a high side contactor control circuit having a primary pull-in circuit and a secondary pull-in circuit. The primary pull-in circuit is operably coupled to the primary microprocessor and a vehicle battery. The secondary pull-in circuit is operably coupled to both the primary pull-in circuit and the secondary microprocessor. The secondary pull-in circuit is further operably coupled to a first logical OR circuit. The first logical OR circuit is further operably coupled to a first end of a first contactor coil of a first contact. The contactor control system further includes a low side contactor control circuit having a primary grounding circuit and a secondary grounding circuit. The primary grounding circuit is operably coupled to the primary microprocessor and a second logical OR circuit. The secondary grounding circuit is operably coupled to the secondary microprocessor and the second logical OR circuit. The primary microprocessor is programmed to send a first command signal to the secondary microprocessor. The secondary microprocessor is programmed to send a second command signal to the secondary grounding circuit to induce the secondary grounding circuit to output a ground level voltage to the first logical OR circuit to induce the first logical OR circuit to output the ground level voltage to a second end of the first contactor coil, in response to the first command signal. The primary microprocessor is further programmed to send a third command signal to the primary grounding circuit to induce the primary grounding circuit to output the ground level voltage to the first logical OR circuit to induce the first logical OR circuit to output the ground level voltage to the second end of the first contactor coil, in response to the third command signal. The primary microprocessor is further programmed to send a fourth command signal to the secondary microprocessor. The secondary microprocessor is further programmed to send a fifth command signal to the secondary pull-in circuit to activate the secondary pull-in circuit in response to receiving the fourth command signal. The primary microprocessor is further programmed to send a sixth command signal to the primary pull-in circuit to induce the primary pull-in circuit to output a first pull-in voltage to the secondary pull-in circuit. The secondary pull-in circuit is adapted to output a second pull-in voltage to the first logical OR circuit in response to receiving the first pull-in voltage. The first logical OR circuit is adapted to output the second pull-in voltage to the first end of the first contactor coil in response to receiving the second pull-in voltage, such that the first contactor coil is energized to close a first contact in the first contactor.

DETAILED DESCRIPTION

Figure 1:
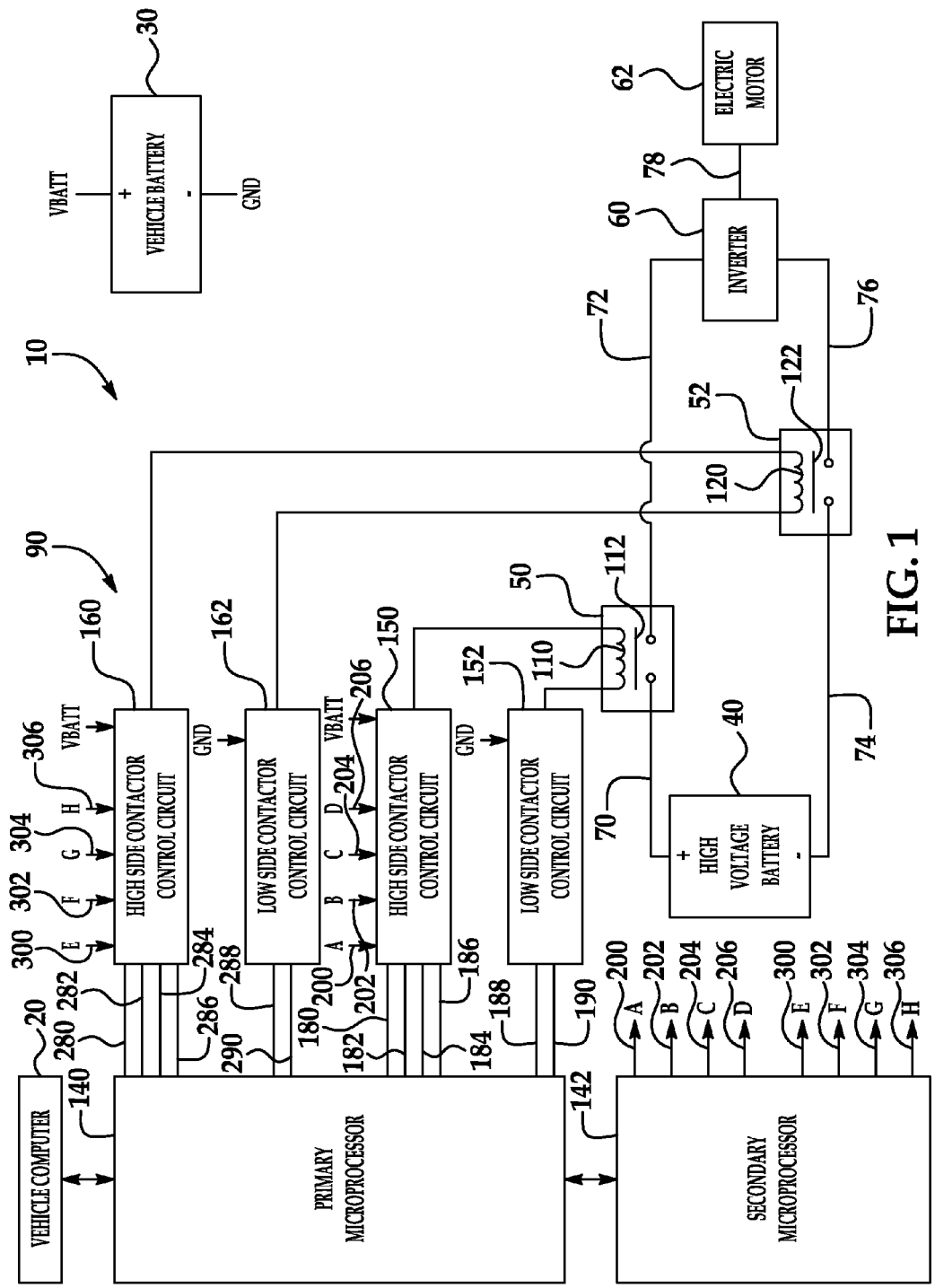
FIG. 1 is a block diagram of an electric vehicle having a contactor control system in accordance with an exemplary embodiment.
Figure 2:
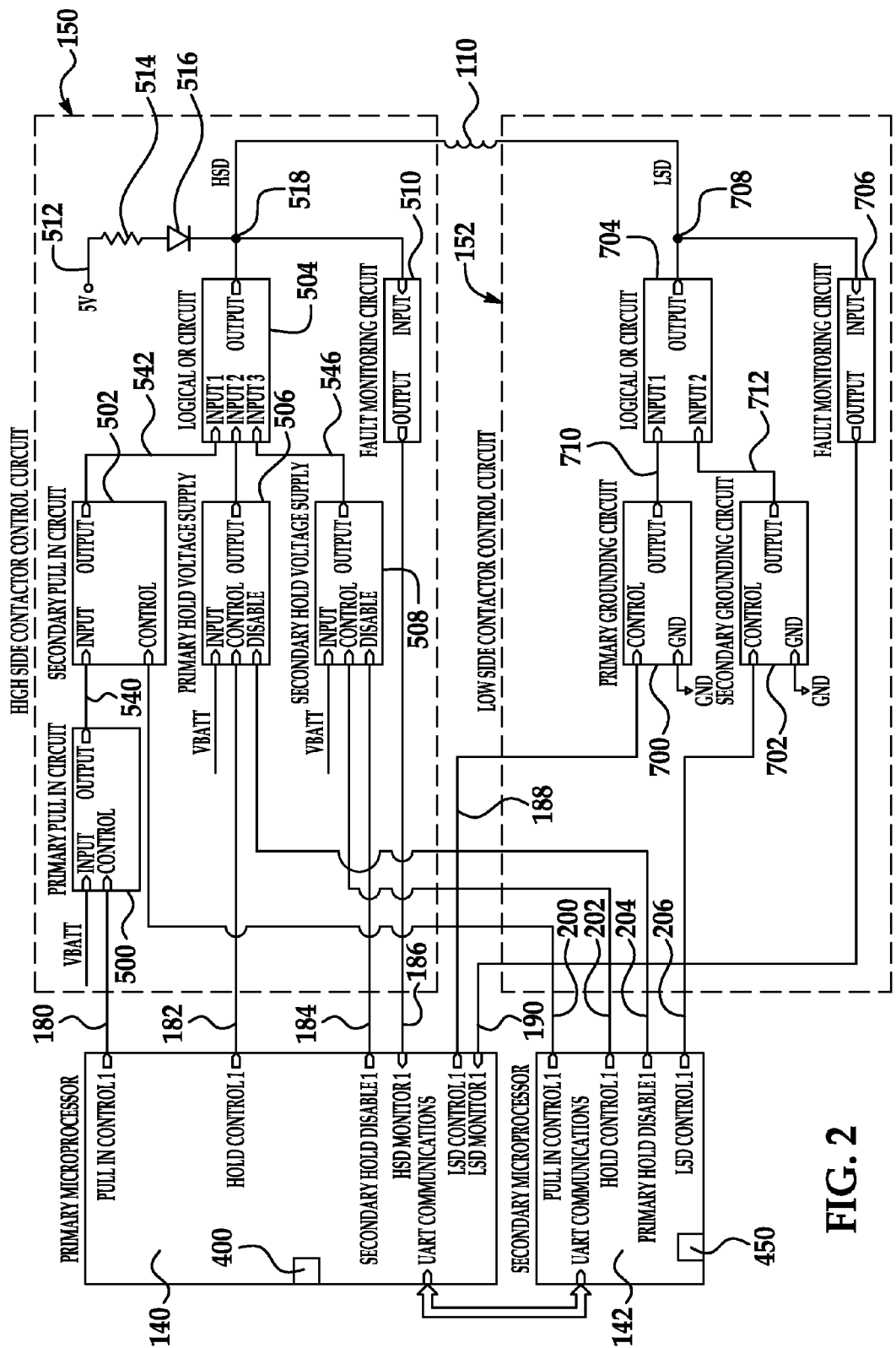
FIG. 2 is a schematic of a portion of the contactor control system of FIG. 1.
Figure 3:
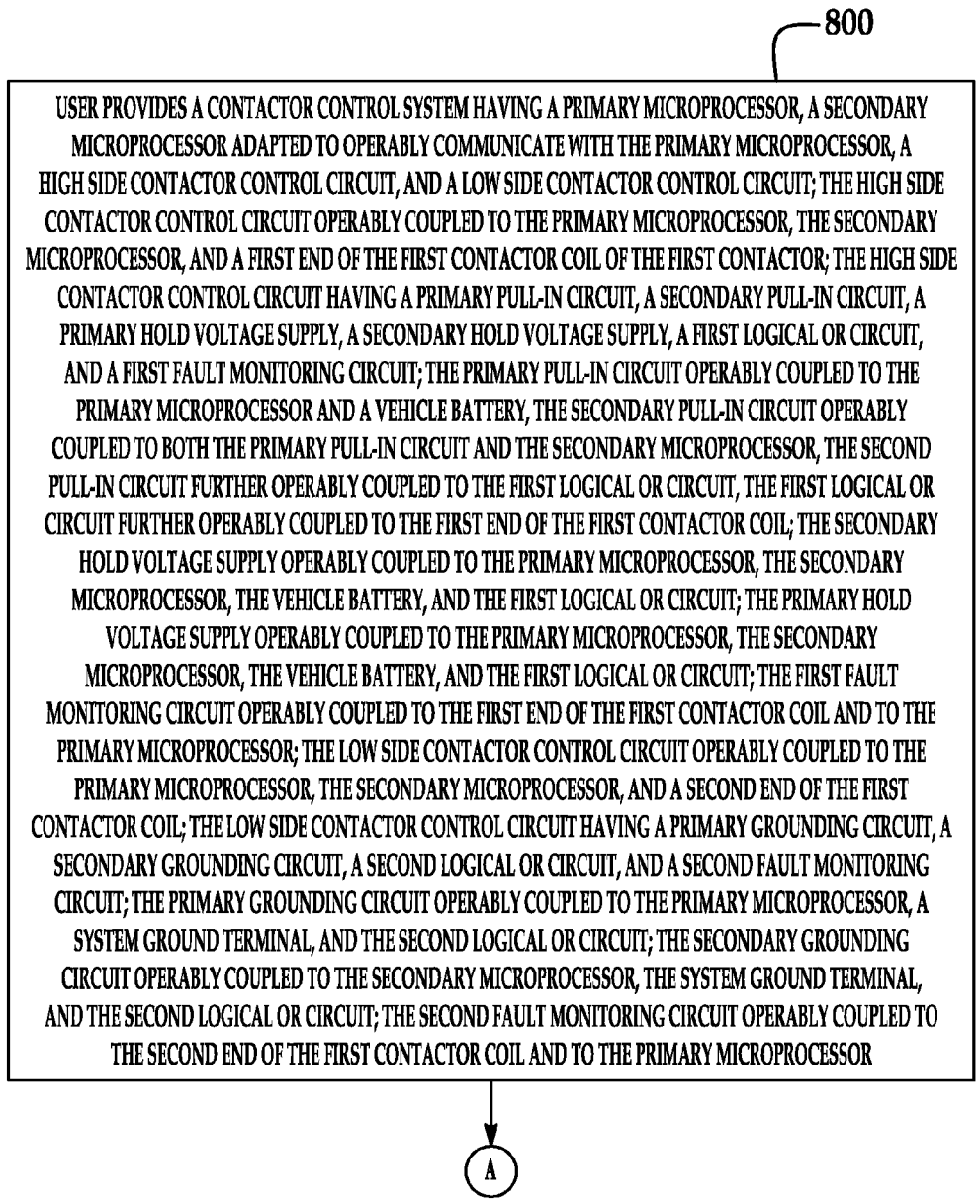
FIGS. 3-8 are flowcharts of a method for controlling a contactor in accordance with another exemplary embodiment.
Figure 4:
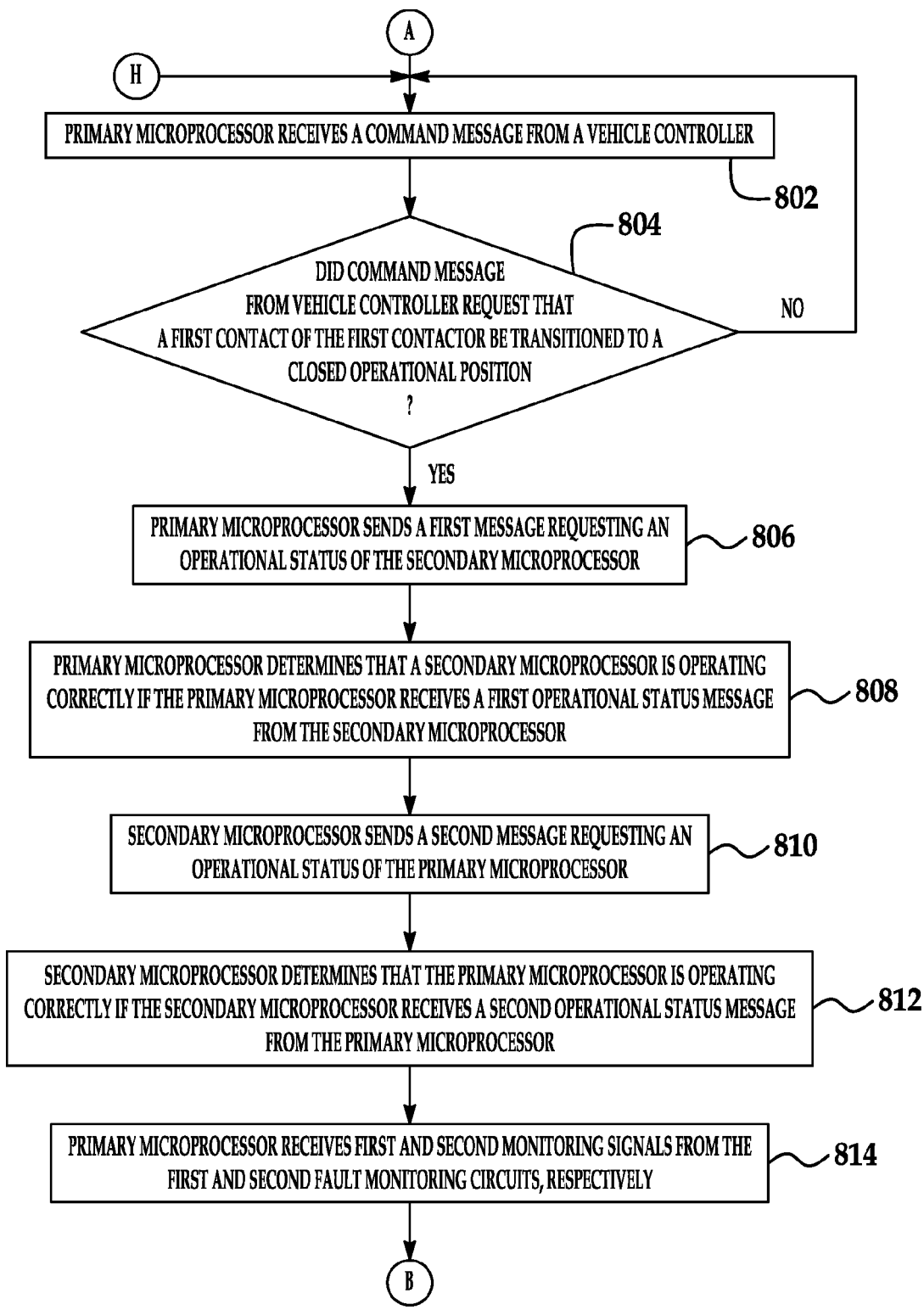
Figure 5:
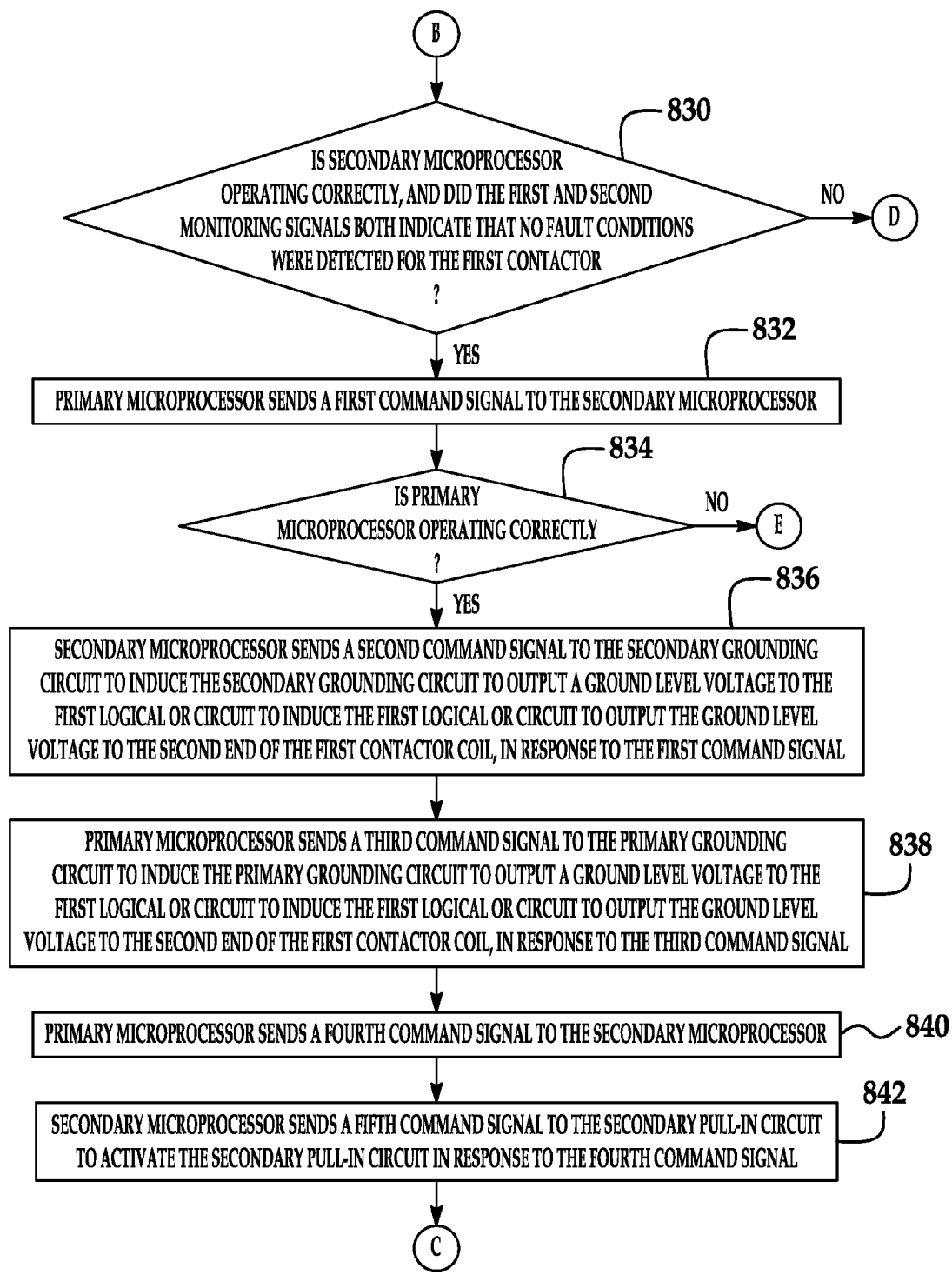
Figure 6:
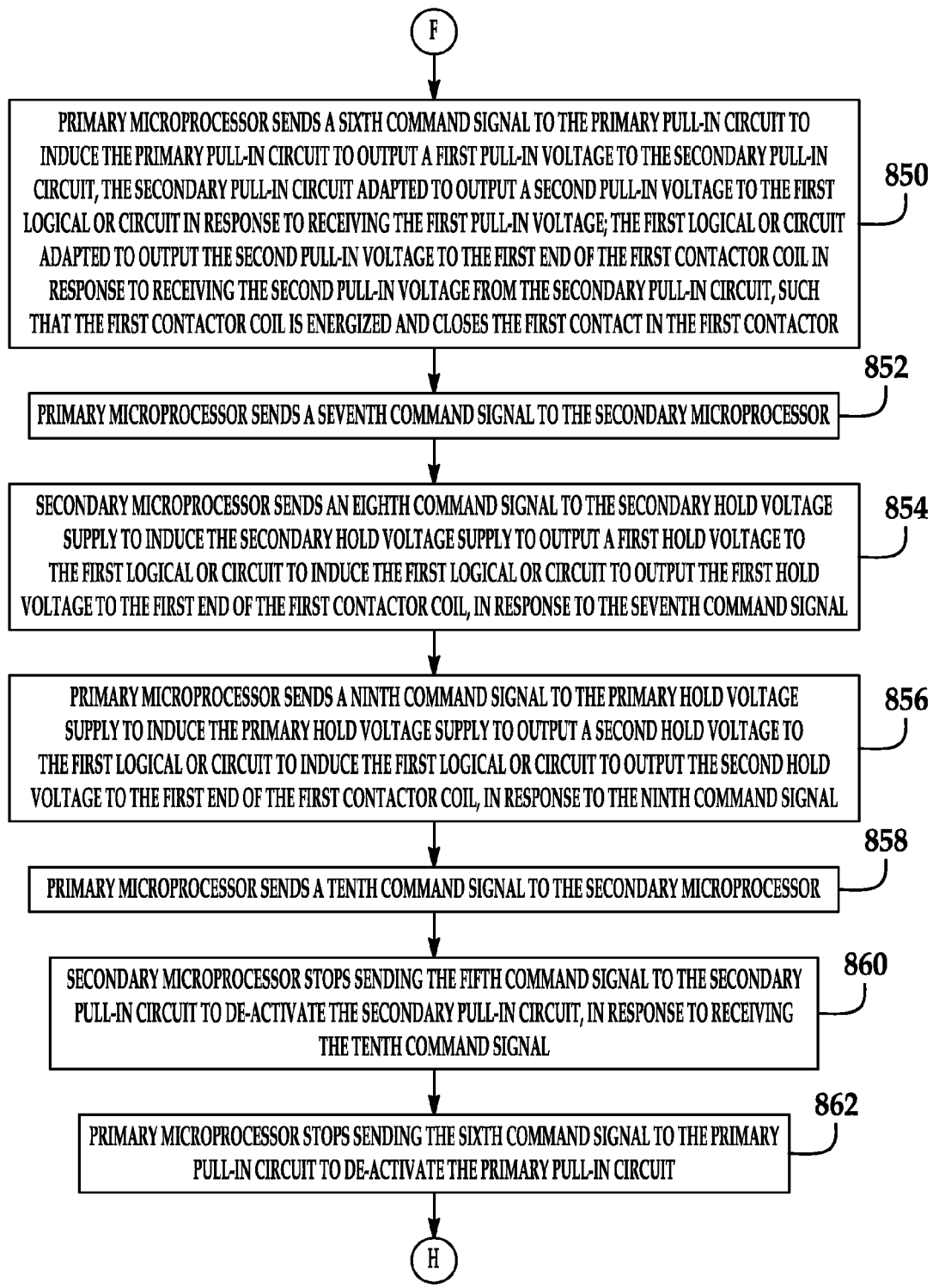
Figure 7:
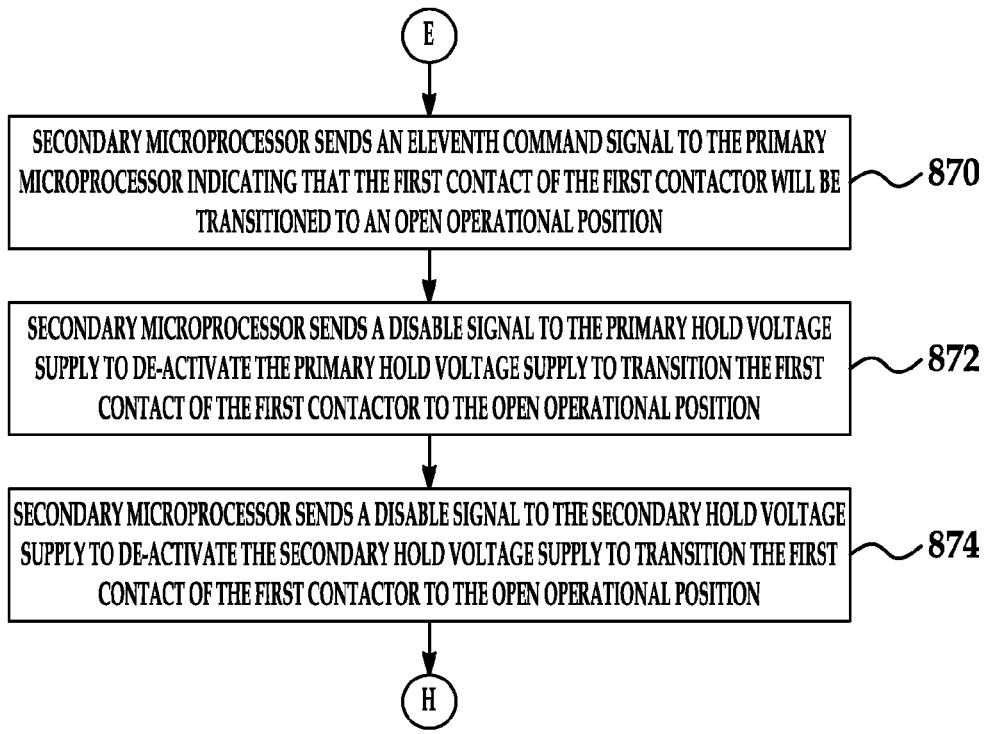
Figure 8:
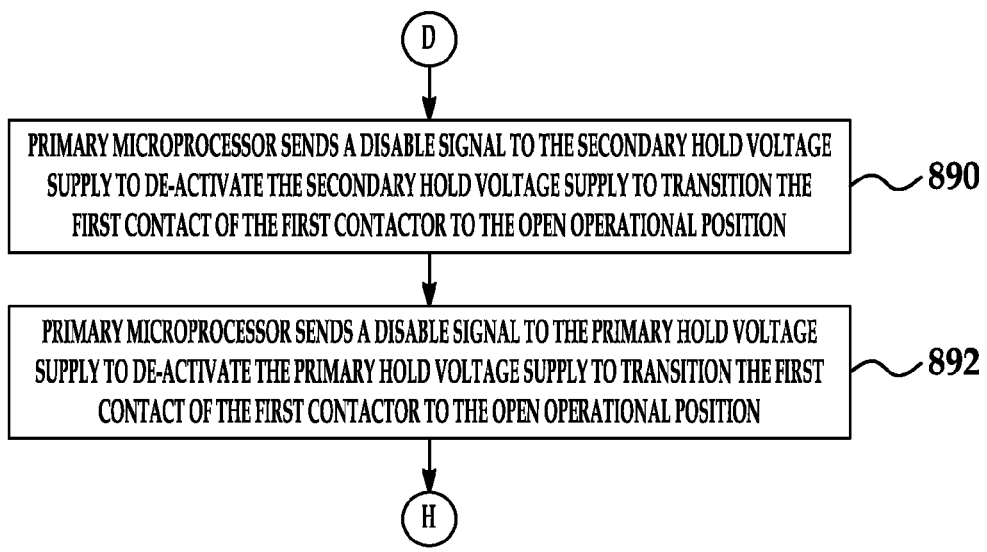

Referring to FIGS. 1 and 2, an electric vehicle 10 is provided. The electric vehicle 10 includes a vehicle computer 20, a vehicle battery 30, a high voltage battery 40, contactors 50, 52, an inverter 60, an electric motor 62, and electrical lines 70, 72, 74, 76 and 78. The electric vehicle 10 further includes a contactor control system 90 in accordance with an exemplary embodiment. An advantage of the contactor control system 90 is that the system 90 utilizes a primary microprocessor 140 and a secondary microprocessor 142 for transitioning the contactor 50 to either a closed operational position or an open operational position. Further, the system 90 utilizes the primary microprocessor 140 and the secondary microprocessor 142 for transitioning the contactor 52 to either a closed operational position or an open operational position.

For purposes of understanding, when two values or two quantities is "substantially equal" to one another, the values are within 20% of each other for purposes of this disclosure.

The vehicle computer 20 operably communicates with the primary microprocessor 140. The vehicle computer 20 is provided to send command messages to the primary microprocessor 140.

The vehicle battery 30 has a positive electrical terminal and a negative electrical terminal. The vehicle battery 30 generates an electrical voltage VBATT between the positive electrical terminal and the negative electrical terminal thereof. The negative electrical terminal is also referred to as the system ground terminal herein. In an exemplary embodiment, the VBATT voltage is a 12 volts DC (VDC) voltage. Of course, in an alternative embodiment, the VBATT voltage could be less than or greater than 12 VDC. The negative terminal has a ground level voltage GND, which also corresponds to the system ground.

The high voltage battery 40 is configured to output an operational voltage to the inverter 60 which outputs operational voltages to the electric motor 62 via the electrical lines 78. In an exemplary embodiment, the high voltage battery 40 outputs an operational voltage at least 24 VDC.

The contactor 50 includes a contactor coil 110 and a contact 112. The contactor 50 is electrically coupled in series between the high voltage battery 40 and the inverter 60. In particular, a positive voltage terminal of the high voltage battery 40 is electrically coupled to a first end of the contact 112 of the contactor 50 via the electrical line 70. Also, a second end of the contact 112 is electrically coupled to the inverter 60 via the electrical line 72. When the contactor coil 110 is energized by the high side contactor control circuit 150 and the low side contactor control circuit 152, the contact 112 has a closed operational position and electrically couples a positive voltage terminal of the high voltage battery 40 to the inverter 60. When the contactor coil 110 is de-energized by either the high side contactor control circuit 150 or the low side contactor control circuit 152, the contact 112 has an open operational position and electrically de-couples the positive voltage terminal of the high voltage battery 40 from the inverter 60.

The contactor 52 includes a contactor coil 120 and a contact 122. The contactor 52 is electrically coupled in series between the high voltage battery 40 and the inverter 60. A negative voltage terminal of the high voltage battery 40 is electrically coupled to a first end of the contact 122 of the contactor 52 via the electrical line 74. Also, a second end of the contact 122 is electrically coupled to the inverter 60 via the electrical line 76. When the contactor coil 120 is energized by the high side contactor control circuit 160 and the low side contactor control circuit 162, the contact 122 has a closed operational position and electrically couples a negative voltage terminal of the high voltage battery 40 to the inverter 60. When the contactor coil 120 is de-energized by either the high side contactor control circuit 160 or the low side contactor control circuit 162, the contact 122 has an open operational position and electrically de-couples the negative voltage terminal of the high voltage battery 40 from the inverter 60.

The inverter 60 is electrically coupled to the electric motor 62 via the electrical line 78. During operation, when both the contact 112 has a closed operational position and the contact 122 has a closed operational position, the operational voltage (e.g., DC voltage) from the high voltage battery 40 is applied to the inverter 60. In response, the inverter 60 generates voltage control signals to induce movement of a rotor of the electric motor 62.

The contactor control system 90 is provided to control operation of the contactors 50, 52. The contactor control system 90 includes a primary microprocessor 140, a secondary microprocessor 142, a high side contactor control circuit 150, a low side contactor control circuit 152, a high side contactor control circuit 160, a low side contactor control circuit 162, electrical lines 180, 182, 184, 186, 188, 190, 200, 202, 204, 206, 280, 282, 284, 286, 288, 290, 300, 302, 304, 306.

The primary microprocessor 140 and the secondary microprocessor 142 are configured to operably communicate with one another. The primary microprocessor 140 and the secondary microprocessor 142 are configured to generate command signals for controlling operation of the high side contactor control circuit 150 and the low side contactor control circuit 152 to control operation of the contactor 50. In particular, when the high side contactor control circuit 150 and the low side contactor control circuit 152 apply a voltage across the contactor coil 110, the contact 112 transitions to a closed operational position. Further, when the high side contactor control circuit 150 or the low side contactor control circuit 152 remove the voltage across the contactor coil 110, the contact 112 transitions to an open operational position.

The primary microprocessor 140 and the secondary microprocessor 142 are further configured to generate command signals for controlling operation of the high side contactor control circuit 160 and the low side contactor control circuit 162 to control operation of the contactor 52. In particular, when the high side contactor control circuit 160 and the low side contactor control circuit 162 apply a voltage across the contactor coil 120, the contact 122 transitions to a closed operational position. Further, when the high side contactor control circuit 160 or the low side contactor control circuit 162 remove the voltage across the contactor coil 120, the contact 122 transitions to an open operational position.

The primary microprocessor 140 is configured to execute a software program stored in a memory device 400 for implementing in part the operational method which will be explained below. The memory device 400 is configured to store software algorithms, values, and status flags therein. The primary microprocessor 140 is electrically coupled to the high side contactor control circuit 150 via the electrical lines 180, 182, 184, 186. Further, the primary microprocessor 140 is electrically coupled to the low side contactor control circuit 152 via the electrical lines 188, 190. Also, the primary microprocessor 140 is electrically coupled to the high side contactor control circuit 160 via the electrical lines 280, 282, 284, 286. Still further, the primary microprocessor 140 is electrically coupled to the low side contactor control circuit 162 via the electrical lines 288, 290.

The secondary microprocessor 142 is configured to execute a software program stored in a memory device 450 for implementing in part the operational method which will be explained below. The memory device 450 is configured to store software algorithms, values, and status flags therein. The secondary microprocessor 142 is electrically coupled to the high side contactor control circuit 150 via the electrical lines 200, 202, 204, 206. Further, the secondary microprocessor 142 is electrically coupled to the high side contactor control circuit 160 via the electrical lines 300, 302, 304, 306.

Referring to FIG. 2, the high side contactor control circuit 150 will now be explained. The high side contactor control circuit 150 includes a primary pull-in circuit 500, a secondary pull-in circuit 502, a logical OR circuit 504, a primary hold voltage supply 506, a secondary hold voltage supply 508, a fault monitoring circuit 510, a voltage supply 512, a resistor 514, a diode 516, an electrical node 518, and electrical lines 540, 542, 544, 546.

The primary pull-in circuit 500 and the secondary pull-in circuit 502 are electrically coupled in series with one another and are jointly utilized to apply the VBATT voltage (or a voltage substantially equal to VBATT) to the logical OR circuit 504 such that the logical OR circuit 504 outputs the VBATT voltage (or a voltage substantially equal to VBATT) to the electrical node 518 which is coupled to a first end of the contactor coil 110 for energizing the contactor 50 (e.g., pulling-in the contact 112) to transition the contact 112 to a closed operational position.

The primary pull-in circuit 500 includes an input terminal, a control terminal, and an output terminal. The input terminal of the primary pull-in circuit 500 is electrically coupled to the positive terminal of the vehicle battery 30 (shown in FIG. 1) and receives the VBATT voltage. The control terminal of the primary pull-in circuit 500 is electrically coupled via the electrical line 180 to the pull-in controll terminal of the primary microprocessor 140 for receiving a command signal from the primary microprocessor 140 for activating or de-activating the primary pull-in circuit 500. The output terminal of the primary pull-in circuit 500 is electrically coupled via the electrical line 540 to the input terminal of the secondary pull-in circuit 502. The output terminal of the primary pull-in circuit 500 outputs the VBATT voltage when the primary pull-in circuit 500 is activated, and stops outputting the VBATT voltage when the primary pull-in circuit 500 is de-activated.

The secondary pull-in circuit 502 includes the input terminal, a control terminal, and output terminal. The input terminal of the secondary pull-in circuit 502 is electrically coupled via the electrical line 540 to the output terminal of the primary pull-in circuit 500. The input terminal of the secondary pull-in circuit 502 receives the VBATT voltage from the primary pull-in circuit 500 when the primary pull-in circuit 500 is activated. The control terminal of the secondary pull-in circuit 502 is electrically coupled via the electrical line 200 to the pull-in controll terminal of the secondary microprocessor 142 for receiving a command signal from the secondary microprocessor 142 for activating or de-activating the secondary pull-in circuit 502. The output terminal of the secondary pull-in circuit 502 outputs the VBATT voltage (or a voltage substantially equal to VBATT) to the logical OR circuit 504 when the secondary pull-in circuit 502 is activated, and stops outputting the VBATT voltage when the secondary pull-in circuit 502 is de-activated.

The primary hold voltage supply 506 is provided to supply a hold DC voltage (e.g., 3 VDC) to the logical OR circuit 504, after the contactor coil 110 has been energized, for maintaining closure of the contact 112. The primary hold voltage supply 506 includes an input terminal, a control terminal, an output terminal, and a disable terminal. The input terminal of the primary hold voltage supply 506 is electrically coupled to the positive terminal of the vehicle battery 30 (shown in FIG. 1) and receives the VBATT voltage. The control terminal of the primary hold voltage supply 506 is electrically coupled via the electrical line 182 to the hold controll terminal of the primary microprocessor 140 for receiving a command signal from the primary microprocessor 140 for activating or de-activating the primary hold voltage supply 506. The output terminal of the primary hold voltage supply 506 outputs the hold DC voltage to the logical OR circuit 504 when the primary hold voltage supply 506 is activated (and not disabled), and stops outputting the hold DC voltage to the logical OR circuit 504 when the primary hold voltage supply 506 is de-activated. The disable terminal of the primary hold voltage supply 506 is electrically coupled via the electrical line 204 to the primary hold disable1 terminal of the secondary microprocessor 142 for receiving a disable signal from the secondary microprocessor 142 for disabling the primary hold voltage supply 506 such that the primary hold voltage supply 506 stops outputting the hold DC voltage.

The secondary hold voltage supply 508 is provided to supply a hold DC voltage (e.g., 3 VDC) to the logical OR circuit 504, after the contactor coil 110 has been energized, for maintaining closure of the contact 112. The secondary hold voltage supply 508 includes an input terminal, a control terminal, an output terminal, and a disable terminal. The input terminal of the secondary hold voltage supply 508 is electrically coupled to the positive terminal of the vehicle battery 30 (shown in FIG. 1) and receives the VBATT voltage. The control terminal of the secondary hold voltage supply 508 is electrically coupled via the electrical line 202 to the hold controll terminal of the secondary microprocessor 142 for receiving a command signal from the secondary microprocessor 142 for activating or de-activating the secondary hold voltage supply 508. The output terminal of the secondary hold voltage supply 508 outputs the hold DC voltage to the logical OR circuit 504 when the secondary hold voltage supply 508 is activated (and not disabled), and stops outputting the hold DC voltage to the logical OR circuit 504 when the secondary hold voltage supply 508 is de-activated. The disable terminal of the secondary hold voltage supply 508 is electrically coupled via the electrical line 184 to the secondary hold disable1 terminal of the primary microprocessor 140 for receiving a disable signal from the primary microprocessor 140 for disabling the secondary hold voltage supply 508 such that the secondary hold voltage supply 508 stops outputting the hold DC voltage.

The logical OR circuit 504 includes first, second, and third input terminals and an output terminal. The first input terminal of the logical OR circuit 504 is electrically coupled via the electrical line 542 to the output terminal of the secondary pull-in circuit 502 for receiving the VBATT voltage (or a voltage substantially equal to VBATT) from the secondary pull-in circuit 502. The second input terminal of the logical OR circuit 504 is electrically coupled via the electrical line 544 to the output terminal of the primary hold voltage supply 506 for receiving the hold DC voltage from the primary hold voltage supply 506. The third input terminal of the logical OR circuit 504 is electrically coupled via the electrical line 546 to the output terminal of the secondary hold voltage supply 508 for receiving the hold DC voltage from the secondary hold voltage supply 508. The output terminal of the logical OR circuit 504 is electrically coupled to the electrical node 518 which is further electrically coupled to a first end of the contactor coil 110. During operation, the logical OR circuit 504 outputs a highest voltage level received on the first, second, and third input terminals of the logical OR circuit 504 to the output terminal thereof.

The resistor 514 and the diode 516 are electrically coupled in series between the voltage supply 512 and the electrical node 518.

The fault monitoring circuit 510 includes an input terminal and an output terminal. The input terminal of the fault monitoring circuit 510 is electrically coupled to the electrical node 518. Further, the output terminal of the fault monitoring circuit 510 is electrically coupled via the electrical line 186 to the HSD monitor1 terminal of the primary microprocessor 140. The fault monitoring circuit 510 outputs a first voltage level on the output terminal thereof indicating a short to ground fault condition if the electrical node 518 (and a first end of the contactor coil 110) is electrically shorted to a ground-level voltage which is received by the primary microprocessor 140. The fault monitoring circuit 510 outputs a second voltage level on the output terminal thereof indicating a short to VBATT fault condition if the electrical node 518 (and a first end of the contactor coil 110) is electrically shorted to a VBATT voltage which is received by the primary microprocessor 140. The fault monitoring circuit 510 outputs a third voltage level on the output terminal thereof indicating an open fault condition if the electrical node 518 (and a first end of the contactor coil 110) has an open operational condition (e.g., the voltage at the electrical node 518 is 5 VDC) which is received by the primary microprocessor 140.

The low side contactor control circuit 152 will now be explained. The low side contactor control circuit 152 includes a primary grounding circuit 700, a secondary grounding circuit 702, a logical OR circuit 704, a fault monitoring circuit 706, an electrical mode 708, and electrical lines 710, 712.

The primary grounding circuit 700 includes a control terminal, a ground terminal, and an output terminal. The control terminal of the primary grounding circuit 700 is electrically coupled via the electrical line 188 to the LSD controll terminal of the primary microprocessor 140 for receiving a command signal from the primary microprocessor 140 for activating or de-activating the primary grounding circuit 700. The ground terminal of the primary grounding circuit 700 is electrically coupled to the negative terminal of the vehicle battery 30 (shown in FIG. 1) and receives the ground (e.g., GND) level voltage. The output terminal of the primary grounding circuit 700 is electrically coupled via the electrical line 710 to a first input terminal of the logical OR circuit 704. The output terminal of the primary grounding circuit 700 outputs a ground-level voltage to the first input terminal of the logical OR circuit 704 when the primary grounding circuit 700 is activated.

The secondary grounding circuit 702 includes a control terminal, a ground terminal, and an output terminal. The control terminal of the secondary grounding circuit 702 is electrically coupled via the electrical line 206 to the LSD controll terminal of the secondary microprocessor 142 for receiving a command signal from the secondary microprocessor 142 for activating or de-activating the secondary grounding circuit 702. The ground terminal of the secondary grounding circuit 702 is electrically coupled to the negative terminal of the vehicle battery 30 (shown in FIG. 1) and receives the ground (e.g., GND) level voltage. The output terminal of the secondary grounding circuit 702 is electrically coupled via the electrical line 712 to a second input terminal of the logical OR circuit 704. The output terminal of the secondary grounding circuit 702 electrically couples the second input terminal of the logical OR circuit 704 to the ground level voltage when the secondary grounding circuit 702 is activated.

The logical OR circuit 704 includes first and second input terminals and an output terminal. The first input terminal of the logical OR circuit 704 is electrically coupled via the electrical line 710 to the output terminal of the primary grounding circuit 700 for receiving the ground level voltage from the primary grounding circuit 700. The second input terminal of the logical OR circuit 704 is electrically coupled via the electrical line 712 to the output terminal of the secondary grounding circuit 702 for receiving the ground level voltage from the secondary grounding circuit 702. The output terminal of the logical OR circuit 704 is electrically coupled to the electrical mode 708 which is further electrically coupled to a second end of the contactor coil 110. During operation, the logical OR circuit 704 couples the electrical node 708 (and the second end of the contactor coil 110) to the ground level voltage when the circuit 704 is activated.

The fault monitoring circuit 706 includes an input terminal and an output terminal. The input terminal of the fault monitoring circuit 706 is electrically coupled to the electrical node 708. Further, the output terminal of the fault monitoring circuit 706 is electrically coupled via the electrical line 190 to the LSD monitor1 terminal of the primary microprocessor 140. The fault monitoring circuit 706 outputs a first voltage level on the output terminal thereof indicating a short to VBATT fault condition if the electrical node 708 (and a second end of the contactor coil 110) is electrically shorted to a VBATT voltage which is received by the primary microprocessor 140.

Referring again to FIG. 1, the high side contactor control circuit 160 has an identical structure as the high side contactor control circuit 150, except that the high side contactor control circuit 160 is electrically coupled to a first end of the contactor coil 120. Further, the low side contactor control circuit 162 has identical structure as the low side contactor control circuit 152, except that the low side contactor control circuit 162 is electrically coupled to a second end of the contactor coil 120.

Referring to FIGS. 3-8, the flowchart of a method for controlling operation of the contactor 50 in accordance with another exemplary embodiment will now be described. It should be noted that a similar methodology would be utilized for controlling the operation of the contactor 52.

At step 800, a user provides the contactor control system 90 having the primary microprocessor 140, the secondary microprocessor 142 adapted to operably communicate with the primary microprocessor 140, the high side contactor control circuit 150, and the low side contactor control circuit 152. The high side contactor control circuit 150 is operably coupled to the primary microprocessor 140, the secondary microprocessor 142, and a first end of a contactor coil 110 of the contactor 50. The high side contactor control circuit 150 has the primary pull-in circuit 500, the secondary pull-in circuit 502, the primary hold voltage supply 506, the secondary hold voltage supply 508, the logical OR circuit 504, and the fault monitoring circuit 510. The primary pull-in circuit 500 is operably coupled to the primary microprocessor 140 and the vehicle battery 30. The secondary pull-in circuit 502 is operably coupled to both the primary pull-in circuit 500 and the secondary microprocessor 142. The secondary pull-in circuit is further operably coupled to the logical OR circuit 504. The logical OR circuit 504 is further operably coupled to the first end of the contactor coil 110. The secondary hold voltage supply 508 is operably coupled to the primary microprocessor 140, the secondary microprocessor 142, the vehicle battery 30, and the logical OR circuit 504. The primary hold voltage supply 506 is operably coupled to the primary microprocessor 140, the secondary microprocessor 142, the vehicle battery 30, and the logical OR circuit 504. The fault monitoring circuit 510 is operably coupled to the first end of the contactor coil 110 and to the primary microprocessor 140. The low side contactor control circuit 152 is operably coupled to the primary microprocessor 140, the secondary microprocessor 142, and a second end of the contactor coil 110. The low side contactor control circuit 152 has the primary grounding circuit 700, the secondary grounding circuit 702, the logical OR circuit 704, and the fault monitoring circuit 706. The primary grounding circuit 700 is operably coupled to the primary microprocessor 140, a system ground terminal (e.g., GND terminal), and the logical OR circuit 704. The secondary grounding circuit 702 is operably coupled to the secondary microprocessor 142, the system ground terminal (e.g., GND terminal), and the logical OR circuit 704. The fault monitoring circuit 706 is operably coupled to the second end of the contactor coil 110 and to the primary microprocessor 140.

At step 802, the primary microprocessor 140 receives a command message from the vehicle controller 20. After step 802, the method advances to step 804.

At step 804, the primary microprocessor 140 makes a determination as to whether the command message from vehicle controller 20 requested that the contact 112 of the contactor 50 be transitioned to a closed operational position. If the value of step 804 equals "yes", the method advances to step 806. Otherwise, the method returns to step 802.

At step 806, the primary microprocessor 140 sends a first message requesting an operational status of the secondary microprocessor 142. After step 806, the method advances to step 808.

At step 808, the primary microprocessor 140 determines that the secondary microprocessor 142 is operating correctly if the primary microprocessor 140 receives a first operational status message from the secondary microprocessor 142. After step 808, the method advances to step 810.

At step 810, the secondary microprocessor 142 sends a second message requesting an operational status of the primary microprocessor 140. After step 810, the method advances to step 812.

At step 812, the secondary microprocessor 142 determines that the primary microprocessor 140 is operating correctly if the secondary microprocessor 142 receives a second operational status message from the primary microprocessor 140. After step 812, the method advances to step 814.

At step 814, the primary microprocessor 140 receives first and second monitoring signals from the fault monitoring circuits 510, 706, respectively. After step 814, the method advances to step 830.

At step 830, the primary processor 140 makes a determination as to whether the secondary microprocessor 142 is operating correctly, whether the first and second monitoring signals both indicate that no fault conditions were detected for the contactor 50. If the value of step 830 equals "yes", the method advances to step 832. Otherwise, the method advances to step 890.

At step 832, the primary microprocessor 140 sends a first command signal to the secondary microprocessor 142. After step 832, the method advances to step 834.

At step 834, the secondary microprocessor 142 makes a determination as to whether the primary microprocessor 140 is operating correctly. If the value of step 834 equals "yes", the method advances to step 836. Otherwise, the method advances to step 870.

At step 836, the secondary microprocessor 142 sends a second command signal to the secondary grounding circuit 702 to induce the secondary grounding circuit 702 to output a ground level voltage to the logical OR circuit 504 to induce the logical OR circuit 504 to output the ground level voltage to the second end of the contactor coil 110, in response to the first command signal. After step 836, the method advances to step 838.

At step 838, the primary microprocessor 140 sends a third command signal to the primary grounding circuit 700 to induce the primary grounding circuit 700 to output the ground level voltage to the logical OR circuit 504 to induce the logical OR circuit 504 to output the ground level voltage to the second end of the contactor coil 110 in response to the third command signal. After step 838, the method advances to step 840.

At step 840, the primary microprocessor 140 sends a fourth command signal to the secondary microprocessor 142. After step 840, the method advances to step 842.

At step 842, the secondary microprocessor 142 sends a fifth command signal to the secondary pull-in circuit 502 to activate the secondary pull-in circuit 502 in response to the fourth command signal. After step 842, method advances to step 850.

At step 850, the primary microprocessor 140 sends a sixth command signal to the primary pull-in circuit 500 to induce the primary pull-in circuit 500 to output a first pull-in voltage to the secondary pull-in circuit 502. The secondary pull-in circuit 502 is adapted to output a second pull-in voltage to the logical OR circuit 504 in response to receiving the first pull-in voltage. The logical OR circuit 504 is adapted to output the second pull-in voltage to the first end of the contactor coil 110 in response to receiving the second pull-in voltage from the secondary pull-in circuit 502, such that the contactor coil 110 is energized and closes the contact 112 in the contactor 50. After step 850, the method advances to step 852.

At step 852, the primary microprocessor 140 sends a seventh command to the secondary microprocessor 142. After step 852, the method advances to step 854.

At step 854, the secondary microprocessor 142 sends an eighth command signal to the secondary hold voltage supply 508 to induce the secondary hold voltage supply 508 to output a first hold voltage to the logical OR circuit 504 to induce the logical OR circuit 504 to output the first hold voltage to the first end of the contactor coil 110, in response to the seventh command signal. After step 854, the method advances to step 856.

At step 856, the primary microprocessor 140 sends a ninth command signal to the primary hold voltage supply 506 to induce the primary hold voltage supply 506 to output a second hold voltage to the logical OR circuit 504 to induce the logical OR circuit 504 to output the second hold voltage to the first end of the contactor coil 110 in response to the ninth command signal. After step 856, the method advances to step 858.

At step 858, the primary microprocessor 140 sends a tenth command signal to the secondary microprocessor 142. After step 858, the method advances to step 860.

At step 860, the secondary microprocessor 142 stops sending the fifth command signal to the secondary pull-in circuit 502 to de-activate the secondary pull-in circuit 502, in response to receiving the tenth command signal. In an exemplary embodiment, the secondary microprocessor 142 delays 50 milliseconds after receiving the tenth command signal, before the secondary microprocessor 142 stops sending the fifth command signal to the secondary pull-in circuit 502. After step 860, the method advances to step 862.

At step 862, the primary microprocessor 140 stops sending the sixth command signal to the primary pull-in circuit 500 to de-activate the primary pull-in circuit 500. After step 862, the method returns to step 802.

Referring again to step 834, if the value of step 834 equals "no" indicating that the primary microprocessor 140 is not operating correctly, the method advances to step 870.

At step 870, the secondary microprocessor 142 sends an eleventh command signal to the primary microprocessor 140 indicating that the contact 112 of the contactor 50 will be transitioned to an open operational position. After step 870, the method advances to step 872.

At step 872, the secondary microprocessor 142 sends a disable signal to the primary hold voltage supply 506 to de-activate the primary hold voltage supply 506 to transition the contact 112 of the contactor 50 to the open operational position. After step 872, the method advances to step 874.

At step 874, the secondary microprocessor 142 sends a disable signal to the secondary hold voltage supply 508 to de-activate the secondary hold voltage supply 508 to transition the contact 112 of the contactor 50 to the open operational position. After step 874, the method returns to step 802.

Referring again to step 830, if the value of step 830 equals "no" indicating that the secondary microprocessor 142 is not operating correctly, or the first monitoring signal indicated a fault condition in the contactor 50, or the second monitoring signal indicated a fault condition in the contactor 50, the method advances to step 890.

At step 890, the primary microprocessor 140 sends a disable signal to the secondary hold voltage supply 508 to de-activate the secondary hold voltage supply 508 to transition the contact 112 of the contactor 50 to an open operational position. After step 890, the method advances to step 892.

At step 892, the primary microprocessor 140 sends a disable signal to the primary hold voltage supply 506 to de-activate the primary hold voltage supply 506 to transition the contact 112 of the contactor 50 to the open operational position. After step 892, the method returns to step 802.

The contactor control system and method described herein provide a substantial advantage over other systems and methods. In particular, an advantage of the contactor control system 90 is that the system 90 utilizes a primary microprocessor 140 and a secondary microprocessor 142 for transitioning the contactor 50 to either a closed operational position or an open operational position. Further, the system utilizes the primary microprocessor 140 and the secondary microprocessor 142 for transitioning the contactor 52 to either a closed operational position or an open operational position.

The above-described diagnostic method can be at least partially embodied in the form of one or more computer readable media having computer-executable instructions for practicing the methods. The computer-readable media can comprise one or more of the following: hard drives, RAM memory, flash memory, and other computer-readable media known to those skilled in the art; wherein, when the computer-executable instructions are loaded into and executed by one or more computers or microprocessors, the one or more computers or microprocessors become an apparatus for practicing the methods.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A contactor control system, comprising:
a primary microprocessor and a secondary microprocessor adapted to operably communicate with one another;
a high side contactor control circuit having a primary pull-in circuit and a secondary pull-in circuit; the primary pull-in circuit operably coupled to the primary microprocessor and a vehicle battery; the secondary pull-in circuit operably coupled to both the primary pull-in circuit and the secondary microprocessor; the secondary pull-in circuit further operably coupled to a first logical OR circuit, the first logical OR circuit further operably coupled to a first end of a first contactor coil of a first contact;
a low side contactor control circuit having a primary grounding circuit and a secondary grounding circuit, the primary grounding circuit operably coupled to the primary microprocessor and a second logical OR circuit; the secondary grounding circuit operably coupled to the secondary microprocessor and the second logical OR circuit;
the primary microprocessor programmed to send a first command signal to the secondary microprocessor;
the secondary microprocessor programmed to send a second command signal to the secondary grounding circuit to induce the secondary grounding circuit to output a ground level voltage to the first logical OR circuit to induce the first logical OR circuit to output the ground level voltage to a second end of the first contactor coil, in response to the first command signal;
the primary microprocessor further programmed to send a third command signal to the primary grounding circuit to induce the primary grounding circuit to output the ground level voltage to the first logical OR circuit to induce the first logical OR circuit to output the ground level voltage to the second end of the first contactor coil, in response to the third command signal;
the primary microprocessor further programmed to send a fourth command signal to the secondary microprocessor;
the secondary microprocessor further programmed to send a fifth command signal to the secondary pull-in circuit to activate the secondary pull-in circuit in response to receiving the fourth command signal; and
the primary microprocessor further programmed to send a sixth command signal to the primary pull-in circuit to induce the primary pull-in circuit to output a first pull-in voltage to the secondary pull-in circuit, the secondary pull-in circuit adapted to output a second pull-in voltage to the first logical OR circuit in response to receiving the first pull-in voltage; the first logical OR circuit adapted to output the second pull-in voltage to the first end of the first contactor coil in response to receiving the second pull-in voltage, such that the first contactor coil is energized to close a first contact in the first contactor.

2. The contactor control system of claim 1, wherein the high side contactor control circuit further comprises a secondary hold voltage supply operably coupled to the primary microprocessor, the secondary microprocessor, the vehicle battery, and the first logical OR circuit;
the primary microprocessor further programmed to send a seventh command to the secondary microprocessor; and
the secondary microprocessor further programmed to send an eighth command signal to the secondary hold voltage supply to induce the secondary hold voltage supply to output a first hold voltage to the first logical OR circuit to induce the first logical OR circuit to output the first hold voltage to the first end of the first contactor coil, in response to the seventh command signal.

3. The contactor control system of claim 2, wherein the high side contactor control circuit further comprises a primary hold voltage supply operably coupled to the primary microprocessor, the secondary microprocessor, the vehicle battery, and the first logical OR circuit; and
the primary microprocessor further programmed to send a ninth command signal to the primary hold voltage supply to induce the primary hold voltage supply to output a second hold voltage to the first logical OR circuit to induce the first logical OR circuit to output the second hold voltage to the first end of the first contactor coil in response to the ninth command signal.

4. The contactor control system of claim 3, wherein:
the primary microprocessor further programmed to send a tenth command signal to the secondary microprocessor;
the secondary microprocessor further programmed to stop sending the fifth command signal to the secondary pull-in circuit to de-activate the secondary pull-in circuit in response to receiving the tenth command signal.

5. The contactor control system of claim 4, wherein the primary microprocessor further programmed to stop sending the sixth command signal to the primary pull-in circuit to de-activate the primary pull-in circuit.

6. The contactor control system of claim 2, wherein the first pull-in voltage is greater than the first hold voltage.

7. The contactor control system of claim 6, wherein the first pull-in voltage is a DC voltage and the first hold voltage is another DC voltage.

8. The contactor control system of claim 1, wherein the second pull-in voltage is substantially equal to the first pull-in voltage.

9. The contactor control system of claim 1, wherein:
the high side contactor control circuit further comprises a first fault monitoring circuit operably coupled to the first end of the first contactor coil and to the primary microprocessor; and
the low side contactor control circuit further comprises a second fault monitoring circuit operably coupled to the second end of the first contactor coil and to the primary microprocessor.

10. The contactor control system of claim 9, wherein:
the primary microprocessor further programmed to receive first and second monitoring signals from the first and second fault monitoring circuits, respectively, both indicating that no fault conditions have been detected for the first contactor.

11. The contactor control system of claim 1, wherein:
the secondary microprocessor further programmed to detect an error condition associated with either the primary microprocessor or the first contactor, when the first contact of the first contactor has a closed operational position;
the secondary microprocessor further programmed to send a seventh command signal to the primary microprocessor indicating that the first contact of the first contactor will be transitioned to an open operational position;
the secondary microprocessor further programmed to send a disable signal to the primary hold voltage supply to de-activate the primary hold voltage supply to transition the first contact of the first contactor to the open operational position; and
the secondary microprocessor further programmed to send a disable signal to the secondary hold voltage supply to de-activate the second hold voltage supply to transition the first contact of the first contactor to the open operational position.

12. The contactor control system of claim 1, wherein:
the primary microprocessor further programmed to detect an error condition associated with either the secondary microprocessor or the first contactor, when the first contact of the first contactor has a closed operational position;
the primary microprocessor further programmed to send a disable signal to the secondary hold voltage supply to de-activate the second hold voltage supply to transition first contact of the first contactor to an open operational position; and
the primary microprocessor further programmed to send a disable signal to the primary hold voltage supply to de-activate the primary hold voltage supply to transition first contact of the first contactor to the open operational position.

13. The contactor control system of claim 1, wherein the primary microprocessor further programmed to receive a command message from a vehicle controller requesting that the first contact of the first contactor be transitioned to a closed operational position.

\* \* \* \* \*